(12) United States Patent
Yuan et al.

(10) Patent No.: US 10,872,638 B2
(45) Date of Patent: Dec. 22, 2020

(54) DATA STORAGE SYSTEM AND METHOD BASED ON DATA TEMPERATURE

(71) Applicant: Western Digital Technologies, Inc., San Jose, CA (US)

(72) Inventors: Jingfeng Yuan, Irvine, CA (US); James M. Higgins, Irvine, CA (US); Jeff Whaley, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/724,081

(22) Filed: Dec. 20, 2019

(65) Prior Publication Data

US 2020/0143847 A1 May 7, 2020

Related U.S. Application Data

(63) Continuation of application No. 16/143,271, filed on Sep. 26, 2018, now Pat. No. 10,559,329, which is a continuation of application No. 15/661,882, filed on Jul. 27, 2017, now Pat. No. 10,115,437.

(60) Provisional application No. 62/524,962, filed on Jun. 26, 2017.

(51) Int. Cl.
| | |
|---|---|
| *G11C 7/04* | (2006.01) |
| *G11C 11/406* | (2006.01) |
| *G11C 5/00* | (2006.01) |
| *G11C 7/24* | (2006.01) |
| *G11C 29/12* | (2006.01) |
| *G11C 5/02* | (2006.01) |

(52) U.S. Cl.
CPC ............. *G11C 5/005* (2013.01); *G11C 5/025* (2013.01); *G11C 7/04* (2013.01); *G11C 7/24* (2013.01); *G11C 11/40626* (2013.01); *G11C 29/12* (2013.01)

(58) Field of Classification Search
CPC ........................... G11C 7/04; G11C 11/40626
See application file for complete search history.

(56) References Cited

U.S. PATENT DOCUMENTS

| | | | |
|---|---|---|---|
| 7,403,440 B2 | 7/2008 | Perner | |
| 7,450,456 B2 | 11/2008 | Jain | |
| 8,724,415 B2 * | 5/2014 | Kuroda | ............... G11C 11/406 365/222 |
| 8,787,105 B2 | 7/2014 | Chen | |
| 9,195,577 B2 * | 11/2015 | Saraswat | ............... G11C 5/025 |

(Continued)

*Primary Examiner* — Son L Mai (74) *Attorney, Agent, or Firm* — Morgan, Lewis & Bockius LLP (57) ABSTRACT

The subject technology performs the following in a storage system including memory dies, where each memory die includes its own temperature sensor. The subject technology determines a temperature of each of the memory dies based on a temperature reading from each memory die's temperature sensor. The subject technology determines whether data is hot data or cold data, where hot data is more likely to be changed after it is written than cold data. In response to determining that the data is hot data, the subject technology stores the data in a memory die with a relatively higher temperature than another one of the memory dies. Further, in response to determining that the data is cold data, the subject technology stores the data in a memory die with a relatively cooler temperature than another one of the memory dies.

20 Claims, 6 Drawing Sheets

(56) References Cited

U.S. PATENT DOCUMENTS

| | | | |
|---|---|---|---|
| 9,342,443 B2 | 5/2016 | Walker | |
| 9,396,787 B2 | 7/2016 | Shoemaker | |
| 9,489,146 B2 | 11/2016 | Erez | |
| 9,570,147 B2 | 2/2017 | Kim | |
| 9,734,887 B1 | 8/2017 | Tavva | |
| 9,786,336 B2 | 10/2017 | Woo | |
| 9,792,172 B2 | 10/2017 | Kanno | |
| 9,830,079 B2 * | 11/2017 | Kanno | G11C 29/52 |
| 10,559,329 B2 * | 2/2020 | Yuan | G11C 11/40626 |
| 2017/0024137 A1 | 1/2017 | Kanno | |

\* cited by examiner

DATA STORAGE SYSTEM AND METHOD BASED ON DATA TEMPERATURE

CROSS-REFERENCE TO RELATED APPLICATIONS

This application is a continuation of application Ser. No. 16/143,271, filed on Sep. 26, 2018, now U.S. Pat. No. 10,559,329, which is a continuation of application Ser. No. 15/661,882, filed on Jul. 27, 2017, now U.S. Pat. No. 10,115,437, which claims the benefit of U.S. Provisional Application No. 62/524,962, filed on Jun. 26, 2017, the entirety of each of which is incorporated by reference.

BACKGROUND

Some storage systems, such as solid state drives (SSDs), have a plurality of non-volatile memory dies for storing data. Although non-volatile, the memory dies may only be able to hold data for a certain amount of time. So, before the data retention time expires, the storage system can "recycle" the data by reading it from its current storage location and writing it back to a different storage location. The data retention time can be dependent on temperature. For example, the amount of time that NAND flash can store data can decrease exponentially as temperature increases. To account for this, some storage systems include one or more temperature sensors on the printed circuit board that is connected to the plurality of memory dies and increase the data retention recycling frequency of the memory dies based on the highest temperature reading taken from the temperature sensors.

DETAILED DESCRIPTION

Overview

By way of introduction, the below embodiments relate to a storage system and method for die-based data retention recycling. In one embodiment, a storage system is provided comprising a controller and a plurality of memory dies. Each of the plurality of memory dies comprises its own temperature sensor, wherein at least one of the memory dies is characterized by a relatively lower endurance than at least one other of the memory dies, and wherein the at least one of the memory dies with the relatively lower endurance is positioned farther away from the controller than the at least one other of the memory dies.

In some embodiments, the storage system is associated with a product line characterized by a temperature profile.

In some embodiments, the plurality of memory dies are positioned on a printed circuit board based on the temperature profile.

In some embodiments, the controller is further configured to write data that is likely to be changed after it is written to a memory die having a relatively higher temperature than another memory die; and write data that is less likely to be changed after it is written to a memory die having a relatively lower temperature than another memory die.

In some embodiments, the controller is further configured to sort the plurality of memory dies into groups based on temperature.

In some embodiments, at least one of the plurality of memory dies comprises a three-dimensional memory.

In some embodiments, the storage system is embedded in a host.

In some embodiments, the storage system is removably connected to a host.

In another some embodiments, a method for die-based data retention recycling is provided. The method is performed in a storage system comprising a plurality of memory dies, wherein each memory die comprises its own temperature sensor. The method comprises determining a temperature of each of the plurality of memory dies based on a temperature reading from each memory die's temperature sensor; determining whether data is hot data or cold data, wherein hot data is more likely to be changed after it is written than cold data; in response to determining that the data is hot data, storing the data in a memory die with a relatively higher temperature than another one of the plurality of memory dies; and in response to determining that the data is cold data, storing the data in a memory die with a relatively cooler temperature than another one of the plurality of memory dies.

In some embodiments, the data is received from a host.

In some embodiments, the data is recycle data.

In some embodiments, the method further comprises in response to determining that the data is hot data, storing the data in a relatively higher quality memory die.

In some embodiments, the method further comprises in response to determining that the data is cold data, storing the data in a relatively lower quality memory die.

In some embodiments, the storage system comprises a solid state drive.

In another embodiment, a storage system is provided comprising a plurality of memory dies, wherein each memory die comprises its own temperature sensor; and means for determining when to start data retention recycling on a memory-die-by-memory die basis based on a temperature reading of each memory die's temperature sensor.

In some embodiments, the storage system further comprises means for matching data temperature with memory die temperature to reduce an amount of data retention recycling for the plurality of memory dies.

In some embodiments, the storage system further comprises means for matching data temperature with memory die quality, wherein lower quality memory dies are used to store cooler data to reduce an amount of data retention recycling for the lower quality memory dies.

In some embodiments, at least one of the plurality of memory dies comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

EMBODIMENTS

Figures 1A, 1B:
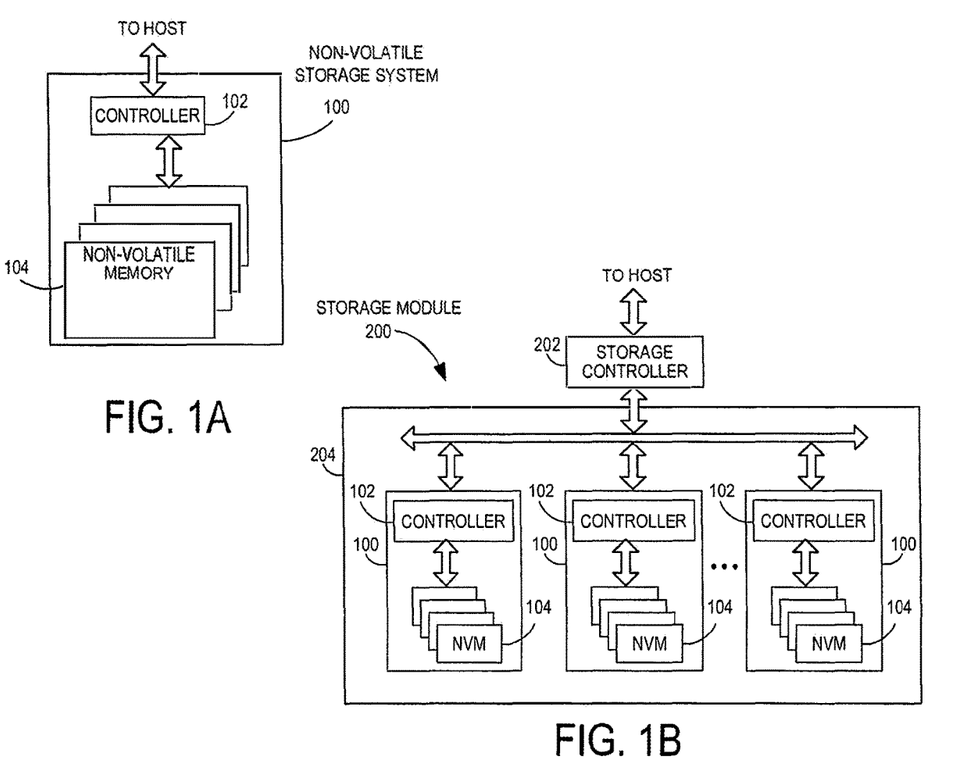
FIG. 1A is a block diagram of a non-volatile storage system of an embodiment.
FIG. 1B is a block diagram illustrating a storage module of an embodiment.
Figure 1C:
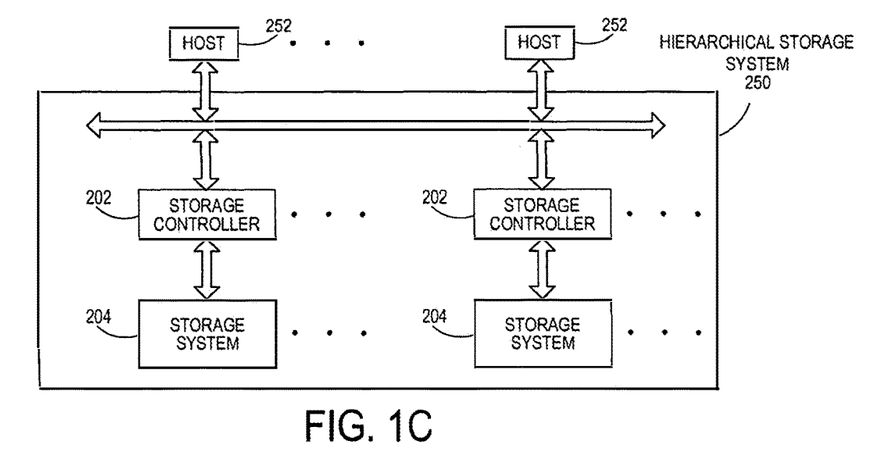
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, ReRAM, PCM, or MRAM controller)) can take the form of processing circuitry, a microprocessor or processor, and a computer-readable medium that stores computer-readable program code (e.g., firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interface express (PCIe) interface, or dual-date-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
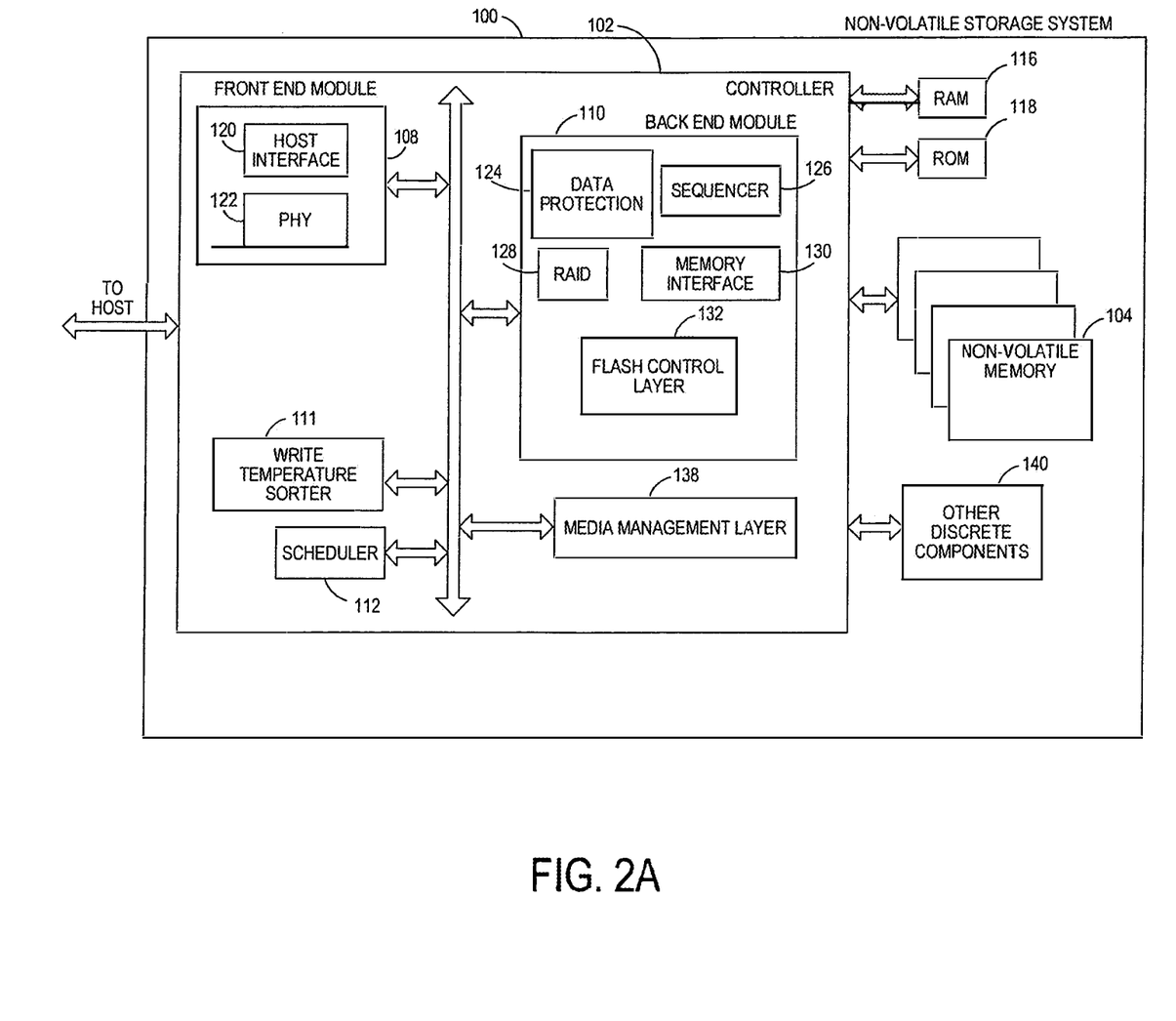
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a write temperature sorter 111 and scheduler 112, which are discussed in more detail below, and can be implemented in hardware or software/firmware.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SA TA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
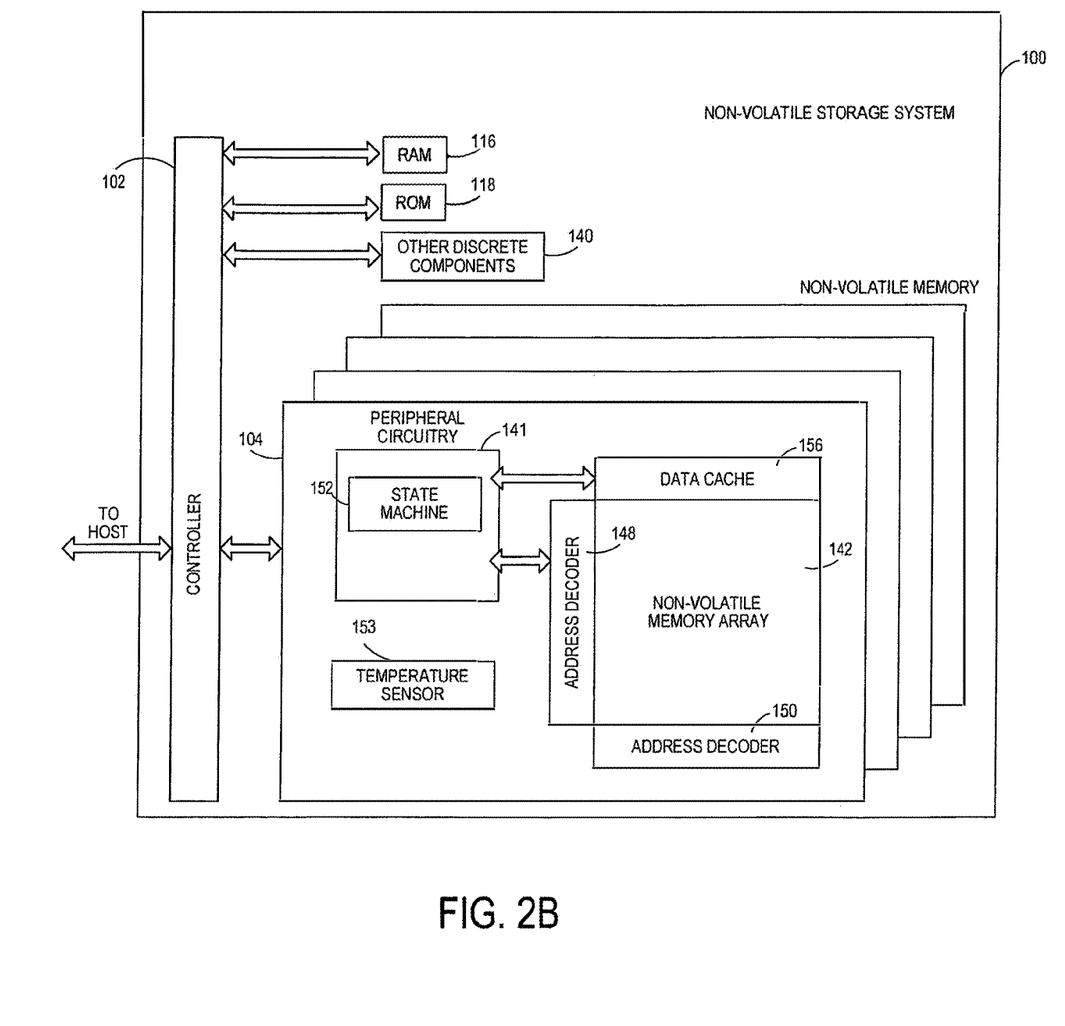
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102. In this embodiment, each of the memory dies contains its own temperature sensor 153.

As mentioned above, data stored in the memory dies 104 needs to be "recycled" over time by reading the data from its current storage location and writing it back to a different storage location. The data retention time can be dependent on temperature, as the amount of time that a memory die can store data can decrease exponentially as temperature increases. To account for this, some storage systems include one or more temperature sensors on the printed circuit board that is connected to the plurality of memory dies. Those temperature sensors are intentionally placed at hot spots in the storage system and are designed to represent the most critical data retention needs for the memory dies that are required to be recycled most often. Some prior storage systems increase the data retention recycling frequency of the memory dies based on the highest temperature reading taken from the temperature sensors.

By using the highest temperature reading, these prior storage systems assume a worst case scenario (i.e., that all memory dies are at the highest temperature reading) to prevent data loss in any of the memory dies. In this way, the storage system can prevent data loss for the hottest memory die in the memory system (the worst-case scenario). However, using this worst-case scenario can reduce performance, as some of the memory dies can be quite cooler than the hottest memory die. For example, the temperature delta between memory dies on opposing corners of a printed circuit board can be as much as 10° C. (or more) depending on the physical board design and air flow. Because temperature acceleration is based on activation energy, memory dies with lower temperature may need data retention recycling as little as ~⅓ often as the hottest memory dies. Accordingly, in prior storage systems that assume a worst case temperature scenario for all the memory dies, resources are spent on performing data retention recycling on some memory dies that do not need it.

This problem can become even more of an issue as the drive size of a storage system, such as a solid state drive (SSD), increases. As drive size gets larger and larger, managing data integrity recycling becomes more difficult because the larger the drive, the more data needs to move around to keep data integrity for retention. Also, larger drives typically operate at higher temperatures, which reduces the amount of time that data can stay in the memory before a refresh is needed. Additionally, large form factor drives may requires tri-fold printed circuit boards, which can cause temperature variation across the different printed circuit boards, as well as within a printed circuit board. Further, if the storage system has a single controller that manages both host writes and data integrity refreshment, recycling data around per unit of time can overtake the bandwidth that the controller has available for host writes.

Figure 3:
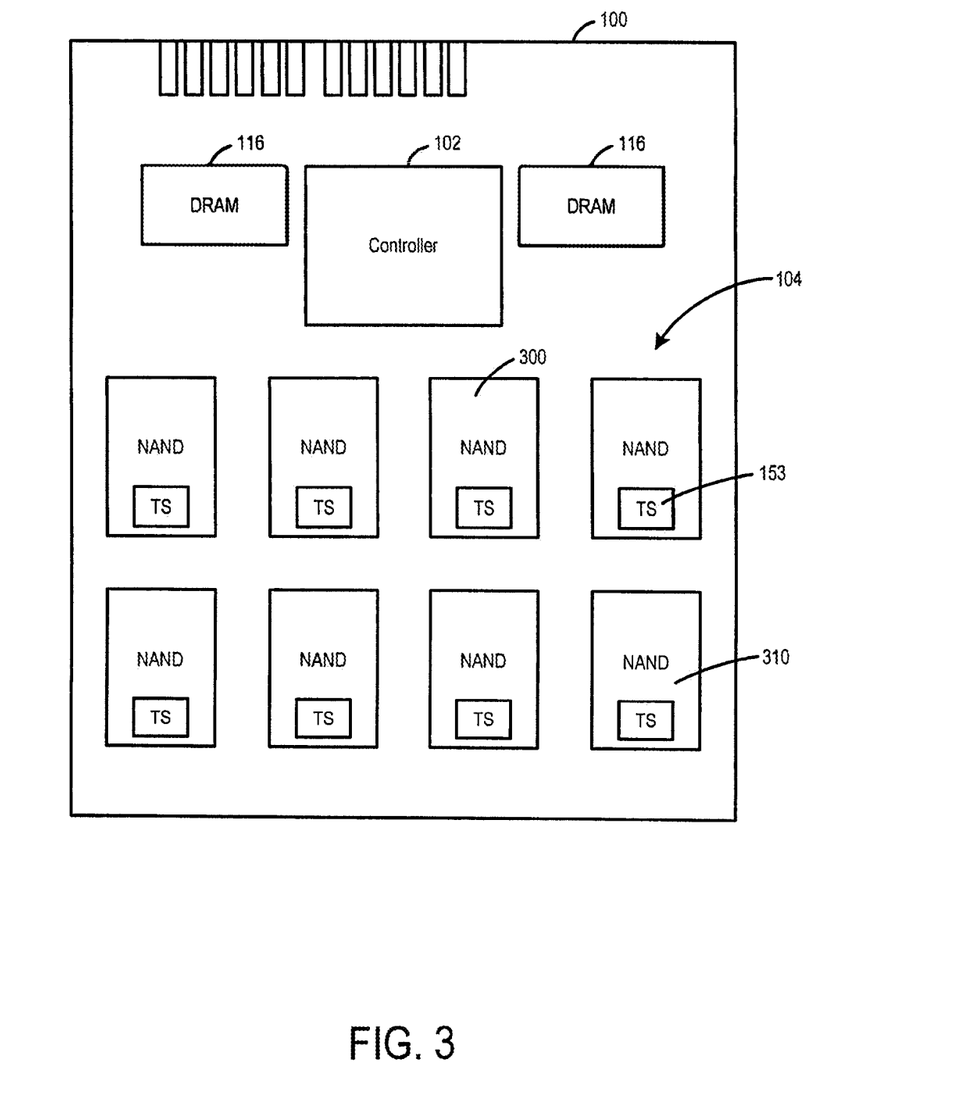
FIG. 3 is a block diagram of a storage system of an embodiment.

The following embodiments break from the prior approach of assuming a worst-case temperature situation for all the memory dies in a storage system. In particular, these embodiments recognize that the storage system's controller 102 and volatile memory (RAM/DRAM) 116 are the dominant thermal sources in the storage system 100 and that a memory die's temperature depends on its distance from the controller 102 and volatile memory 116. So, with reference to FIG. 3, memory die 300 would have a higher temperature that memory die 310.

In one embodiment, the controller 102 is configured to determine when to start data retention recycling of each memory die 104 on a memory-die-by-memory die basis based on a temperature reading of that memory die's temperature sensor 153. That is, these embodiments can determine to start data retention recycling based on individual memory die temperature instead of based on readings from one or two temperature sensors representing the hottest memory dies, as in prior storage systems. In operation, the controller 102 can read the value of each temperature sensor 153 on each die 104 to determine the distribution of temperatures over the plurality of memory dies 104 (e.g., the controller 102 can read the temperature code ("TEMP CO") from the temperature sensors 153). The controller 102 can used a table or other data structure to determine the data retention recycling frequency appropriate for the temperature reading taken from a given memory die. In this way, the controller 102 may determine that the data retention recycling is needed on some memory dies (e.g., those closer to the controller 102) but not other memory dies (e.g., those farther away from the controller 102). As a result, these embodiments can avoid over recycling on those unnecessary (usually "cooler" memory dies, which are allowed to keep data longer before data refreshment is needed). By using such a localized refresh algorithm, the controller 102 is able to reduce unnecessary data recycling activities to help the storage system 100 preserve higher bandwidth for host writes and help preserve the memory dies' program/erase endurance to reduce memory cell damage from wearing.

In another embodiment, the temperature variation across the printed circuit board is used to position different memory dies in different locations on the printed circuit board. For example, due to how a memory die is manufactured, some memory dies may be characterized by a relatively lower endurance than other memory dies (i.e., some memory dies may be "weaker" than others). If a memory die has a relatively low endurance, it may be preferred to avoid frequent data retention recycling operations to that memory die. Knowing that the temperature on a printed circuit board is cooler farther away from the controller 102, a storage system manufacturer can choose to put "weaker" memory dies in locations that are known to be cooler (so they will require less frequent data retention recycling operations) and put "stronger" memory dies in locations that are known to be warmer (as they will require more frequent data retention recycling operations). For example, memory die 310 in FIG. 3 can be a weaker memory die because it is farthest away from the controller 102, whereas memory die 300 can be a stronger die because it is closest to the controller 102. That is, by putting "weaker" memory dies in physically cooler places in the storage system 100, this embodiment allows slower data retention refresh frequency for those memory dies, thereby reducing wear on memory cells in those memory dies. In this way, the memory dies positioned in the colder regions of the storage system 100 can recycle less often than the memory dies positioned in the hotter regions of the storage system, thereby saving endurance caused by wearing. If a particular storage system product configuration has a consistent temperature profile, this temperature profile can be used to determine temperature variations based on characterization per product configuration and physical printed circuit board design (i.e., the memory dies can be positioned on the printed circuit board based on the temperature profile). Temperature separation may be different on a low-usage drive versus a high-usage drive.

Figure 4:
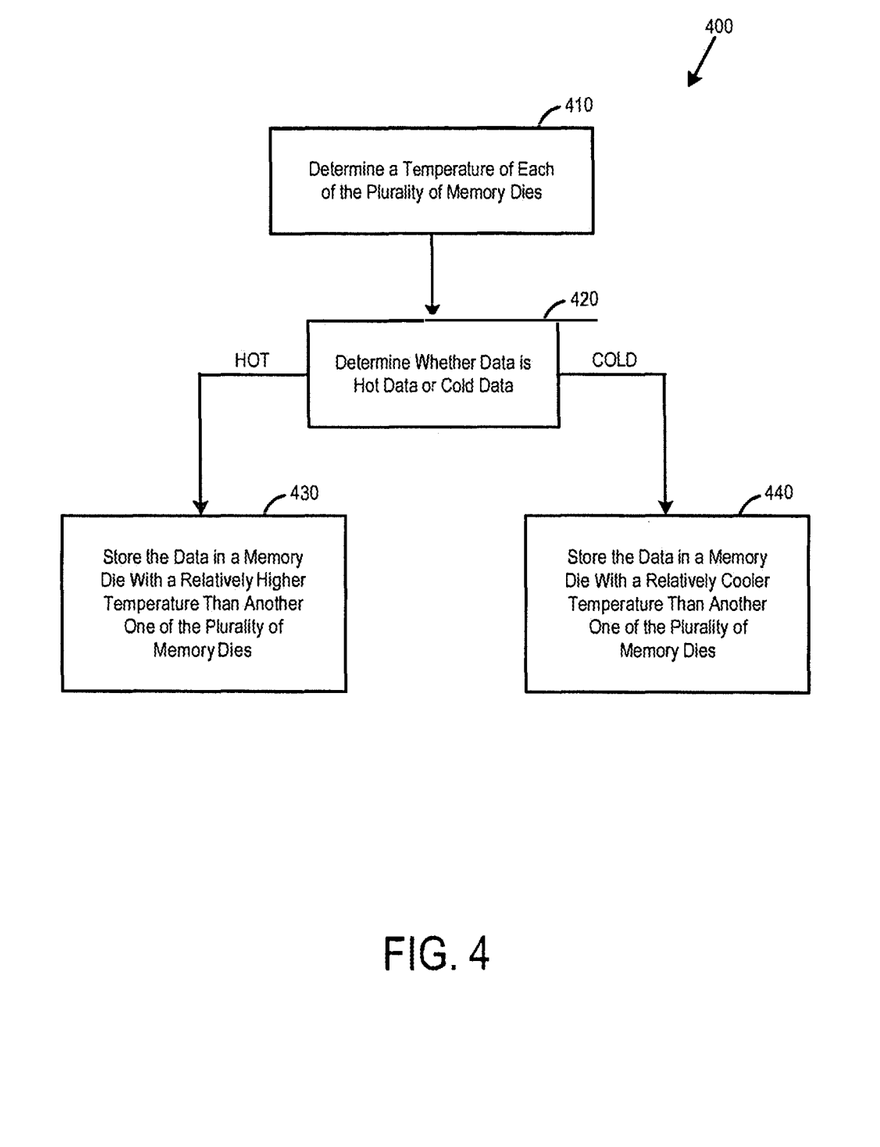
FIG. 4 is a flow chart of a method of an embodiment for die-based data retention recycling.

In another embodiment, the controller 102 is configured to direct different types of data to different memory dies based on both the likelihood that the data will be refreshed and the temperature of the memory die. The data can be, for example, data received from a host or recycled data from one of the memory dies 104. This embodiment will be illustrated in conjunction with the flow chart 400 of FIG. 4. As shown in FIG. 4, in one embodiment, the controller 102 determines the temperature of each of the plurality of memory dies 104 based on a temperature reading from each memory die's temperature sensor 153 (act 410).

The controller 102 then determines whether the data is "hot" data (sometimes referred to herein as "write hot" data) or "cold" data (sometimes referred to herein as "write cold" data) (act 420). As used herein, "hot" and "cold" data refers not to a physical temperature but rather to how likely it is that the data will be changed after it is written, with hot data being more likely to be changed than cold data. The controller 102 can determine whether data is hot or cold in any suitable way. For example, the controller 102 can store a record of logical block addresses (LB As) of write commands received from a host, and the record can contain parameters such as a time stamp of the write command, a hit count (counting the number of hits in a given window), and a data temperature (hot or cold) tag, which the controller 102 can use to identify hot/cold LBAs according to a given definition of hot and cold. As another example, the controller 102 can categorize data according to its size (i.e., data that is written in small data chunks vs. data that is written in large data chunks). The assumption of this approach is that data that is stable may be already given by the host in large data chunks, while data which is subject to frequent change cannot be aggregated into large data chunks. As yet another example, the controller 102 can differentiate between hot and cold data by compressing the write data and checking the compression ratio. Considering that multimedia files are already compressed, it would be possible to classify them as cold data after evaluating the compression ratio of write data. In such a method, hot data (e.g., file system metadata) may be effectively compressed, and the cold data (e.g., multimedia data) may not because it is already encoded. Of course, these are just examples, and the storage system 100 can use any one of these or any other suitable technique.

If the controller 102 determines that the data is hot data, the controller 102 can store the data in a memory die with a relatively higher temperature than another one of the plurality of memory dies 104 (act 430). In contrast, if the controller 102 determines that the data is cold data, the controller 102 can store the data in a memory die with a relatively lower temperature than another one of the plurality of memory dies 104 (act 440). Matching data temperature with memory die temperature in this way can reduce an amount of data retention recycling needed for the plurality of memory dies 104. That is, since hot data is likely to be changed, it is highly possible that the data will be invalidated (because the changed/updated data is written in another memory location) before the data needs to be refreshed, even though the memory die has a higher recycling frequency (because of the physical temperature of the memory die). Likewise, the controller 102 can write data that will be updated/modified/refreshed less frequently (cold data) to a memory die that has a lower physical temperature, thereby minimizing the amount of retention-refresh work that the storage system 100 performs. Both approaches can minimize background tasks. That is, by better managing data workload based on each individual memory die's physical temperature, the storage system 100 can match data temperature with die temperature to save retention recycling.

Figure 5:
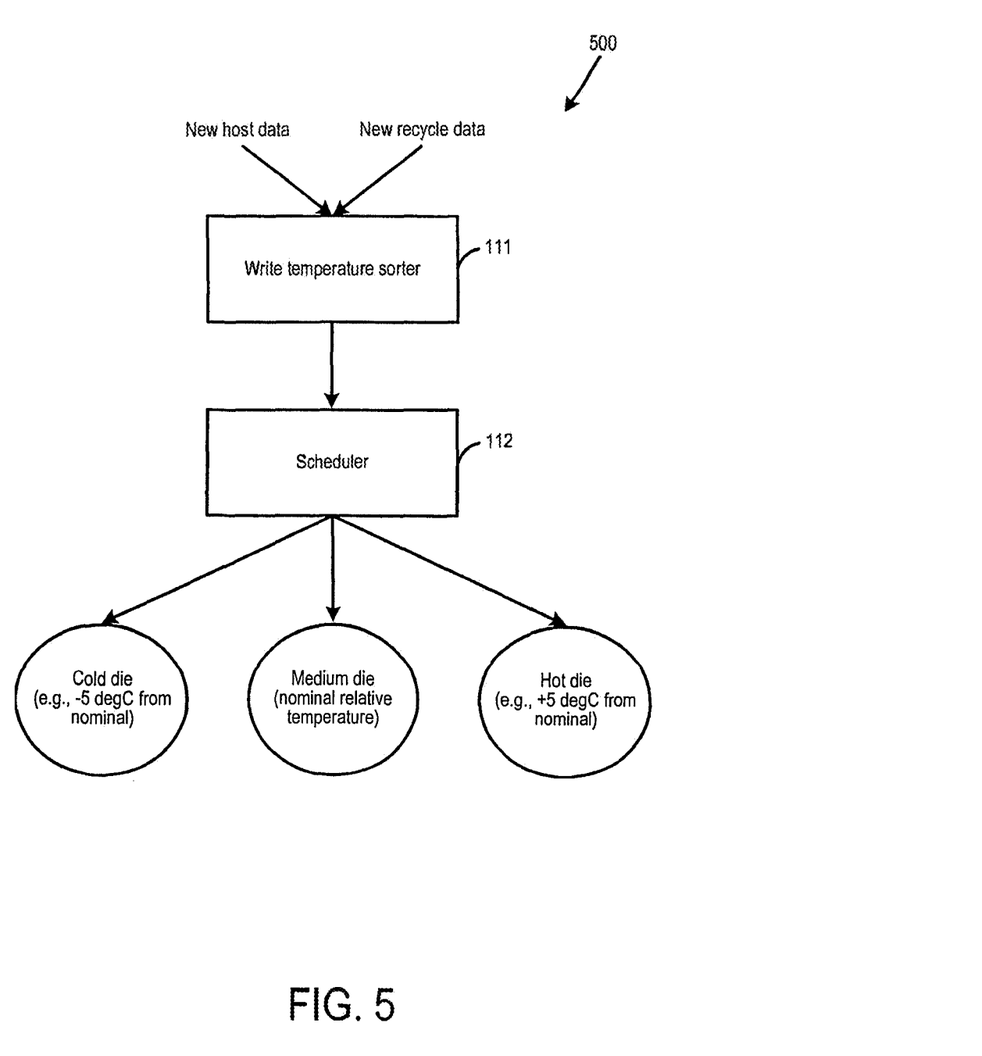
FIG. 5 is a diagram illustrating an operation of a storage system of an embodiment.

FIG. 5 is a diagram 500 illustrating these operations in one implementation of an embodiment, in which the storage system 100 takes different write temperatures and a different memory die physical temperatures and uses both to decide where to place new data on the media. As shown in FIG. 5, when the controller 102 receives data to be written (e.g., new host data or new recycle data to be moved from an existing storage location in memory), the write temperature sorted 111 determines whether the data is "hot data" or "cold data" (e.g., using the techniques discussed above or other techniques). The scheduler 112 then schedules where the data should be stored based on the physical temperature of each memory die. In this example, the memory dies 104 are sorted into three categories: cold (e.g., −5° C. from nominal), medium (e.g., nominal), and hot (e.g., +5° C. from nominal). The storage system 100 can group memory dies for scheduling and parity purposes, and in that case, the storage system 100 can inform the makeup of those collections based at least partially on physical-die-temperature similarities. It should be noted that this is just an example and that other implementations can be used. For example, while certain components are shown and three different physical-temperature sorts and sort thresholds are used, other implementations are possible. Once the memory dies are sorted by physical temperature, the storage system 100 can direct write-cold data to physically colder group of dies and write-hot data to the physically hotter group of dies.

In another embodiment, instead of matching data temperature with memory die temperature, the controller 102 can match data temperature with memory die quality, wherein lower quality memory dies are used to store cooler data to reduce an amount of data retention recycling for the lower quality memory dies. That is, matching data temperature with die quality allows the storage system 100 to utilize lower quality memory dies in physically cooler locations to store colder data, as such dies will have less retention refresh needs. In operation, the controller 102 can be consult a table or other data structure or read a register on the memory die, for example, to determine the memory die's quality. However, if memory die quality is used to place lower quality memory dies in cooler areas of the storage system 100, the determination of where to store hot and cold data may be based on memory die temperature.

There are several advantages associated with these embodiments. For example, these embodiments can reduce host performance impact by not doing unnecessary recycling, which is triggered by individual memory die temperature instead of the highest temperature point on the storage system. This can provide lower write amplification, which can result in reduced endurance requirements for the memory dies. This can also improve the power profile by reducing background tasks to avoid over recycling. These embodiments can also lower the cost of the storage system by utilizing weaker memory dies, which usually implicate higher acceptable production yield. These embodiment can also be particularly advantageous in larger storage system (e.g., very large solid state drives (SSDs)), where working temperature increases with size without a commensurate increase in controller capacity and bandwidth. Also, such storage system can have a higher performance requirement due to an increased front end host bandwidth.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A data storage system, comprising:
a plurality of memory devices; and
a controller configured to cause:
determining when to start data retention recycling on a memory-device-by-memory-device basis based on a temperature of each of the plurality of memory devices;
determining whether data is hot data or cold data; and
when the data is cold data, storing the data in a first one of the plurality of memory devices, wherein the first one of the plurality of memory devices is located farther away from the controller than a second one of the plurality of memory devices,
wherein cold data is less likely to be changed after it is written than hot data.

2. The data storage system of claim 1, wherein when the data is hot data, the controller is configured to cause: storing the data in the second one of the plurality of memory devices, wherein the second one of the plurality of memory devices is located closer to the controller than the first one of the plurality of memory devices.

3. The data storage system of claim 1, wherein each of the plurality of memory devices comprises a temperature sensor, and wherein the determining when to start data retention recycling comprises:
determining when to start data retention recycling on a memory-device-by-memory-device basis based on a temperature reading of each respective temperature sensor.

4. The data storage system of claim 1, wherein a quality of the first one of the plurality of memory devices is lower than a quality of the second one of the plurality of memory devices.

5. The data storage system of claim 4, wherein a quality of a first group of the plurality of memory devices is lower than a quality of a second group of the plurality of memory devices, wherein the first group comprises the first one of the plurality of memory devices, and wherein when the data is cold data, the controller is configured to cause: storing the data in the first group to reduce an amount of data retention recycling for the first group.

6. The data storage system of claim 1, wherein the first one of the plurality of memory devices has a cooler temperature than the second one of the plurality of memory devices.

7. The data storage system of claim 1, wherein at least one of the plurality of memory devices comprises a three-dimensional memory.

8. The data storage system of claim 1, wherein the data is received from a host.

9. The data storage system of claim 1, wherein the data is recycle data.

10. A method for a data storage system, comprising:
determining when to start data retention recycling on a memory-device-by-memory-device basis based on a temperature of each of a plurality of memory devices;
determining whether data is hot data or cold data; and
when the data is cold data, storing the data in a first one of a plurality of memory devices, wherein the first one of the plurality of memory devices is located farther away from a controller than a second one of the plurality of memory devices,
wherein cold data is less likely to be changed after it is written than hot data.

11. The method of claim 10, wherein when the data is hot data, the method comprises: storing the data in the second one of the plurality of memory devices, wherein the second one of the plurality of memory devices is located closer to the controller than the first one of the plurality of memory devices.

12. The method of claim 10, wherein each of the plurality of memory devices comprises a temperature sensor, and wherein the determining when to start data retention recycling comprises: determining when to start data retention recycling on a memory-device-by-memory-device basis based on a temperature reading of each respective temperature sensor.

13. The method of claim 10, wherein the first one of the plurality of memory devices has a cooler temperature than the second one of the plurality of memory devices.

14. The method of claim 10, wherein at least one of the plurality of memory devices comprises a three-dimensional memory.

15. The method of claim 10, wherein a quality of the first one of the plurality of memory devices is lower than a quality of the second one of the plurality of memory devices.

16. The method of claim 15, wherein a quality of a first group of the plurality of memory devices is lower than a quality of a second group of the plurality of memory devices, wherein the first group comprises the first one of the plurality of memory devices, and wherein when the data is cold data, the method comprises: storing the data in the first group to reduce an amount of data retention recycling for the first group.

17. A data storage system, comprising:
means for determining when to start data retention recycling on a memory-device-by-memory-device basis based on a temperature of each of a plurality of memory devices;
means for determining whether data is hot data or cold data; and
when the data is cold data, means for storing the data in a first one of a plurality of memory devices, wherein the first one of the plurality of memory devices is located farther away from a controller than a second one of the plurality of memory devices,
wherein cold data is less likely to be changed after it is written than hot data.

18. The data storage system of claim 17, wherein when the data is hot data, the data storage system comprises: means for storing the data in the second one of the plurality of memory devices, wherein the second one of the plurality of memory devices is located closer to the controller than the first one of the plurality of memory devices.

19. The data storage system of claim 17, wherein the first one of the plurality of memory devices is configured to have a cooler temperature than the second one of the plurality of memory devices.

20. The data storage system of claim 17, wherein each of the plurality of memory devices comprises a temperature sensor, and wherein the means for determining when to start data retention recycling comprises: means for determining when to start data retention recycling on a memory-device-by-memory-device basis based on a temperature reading of each respective temperature sensor.

* * * * *